(12) United States Patent
Sun et al.

(10) Patent No.: US 8,287,304 B1
(45) Date of Patent: Oct. 16, 2012

(54) FLAT FLEXIBLE CABLE WITH A DATA CONNECTOR AND A POWER CONNECTOR AT ONE END

(75) Inventors: Zheng-Heng Sun, Tu-Cheng (TW); An-Gang Liang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/163,763

(22) Filed: Jun. 20, 2011

(30) Foreign Application Priority Data

May 12, 2011 (CN) .......................... 2011 1 0121598

(51) Int. Cl.
*H01R 12/24* (2006.01)

(52) U.S. Cl. ...................................................... 439/494

(58) Field of Classification Search .................. 439/494, 439/492, 496, 499, 55, 67
See application file for complete search history.

(56) References Cited

U.S. PATENT DOCUMENTS

| | | | |
|---|---|---|---|
| 6,246,578 B1 * | 6/2001 | Wei et al. | 361/679.4 |
| 6,336,830 B1 * | 1/2002 | Lee | 439/676 |
| 6,522,532 B2 * | 2/2003 | Liao et al. | 361/679.43 |
| 8,142,219 B1 * | 3/2012 | Zhao et al. | 439/367 |

* cited by examiner

*Primary Examiner* — Chandrika Prasad
(74) *Attorney, Agent, or Firm* — Altis Law Group, Inc.

(57) ABSTRACT

An electronic device includes a housing, a circuit board arranged in the housing, an electronic module arranged in the housing, and a flexible flat cable (FFC). Two first connectors are arranged on the circuit board. The electronic module includes a second connector. The FFC includes a cable connector arranged at a first end and two spaced edge connectors arranged on a second end. Wherein the cable connector is electronically connected to the second connector of the electronic module, the edge connectors are respectively electronically connected to the first connectors.

4 Claims, 3 Drawing Sheets

FLAT FLEXIBLE CABLE WITH A DATA CONNECTOR AND A POWER CONNECTOR AT ONE END

BACKGROUND

1. Technical Field

The present disclosure relates to an electronic device.

2. Description of Related Art

Some electronic modules have a connector that needs a plurality of data cables and power cables to connect to a motherboard, those are generally disorderly arranged, thus occupying a lot of space of electronic devices accommodating the electronic modules.

BRIEF DESCRIPTION OF THE DRAWINGS

Many aspects of the present embodiments can be better understood with reference to the following drawing. The components in the drawing are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Figure 1:
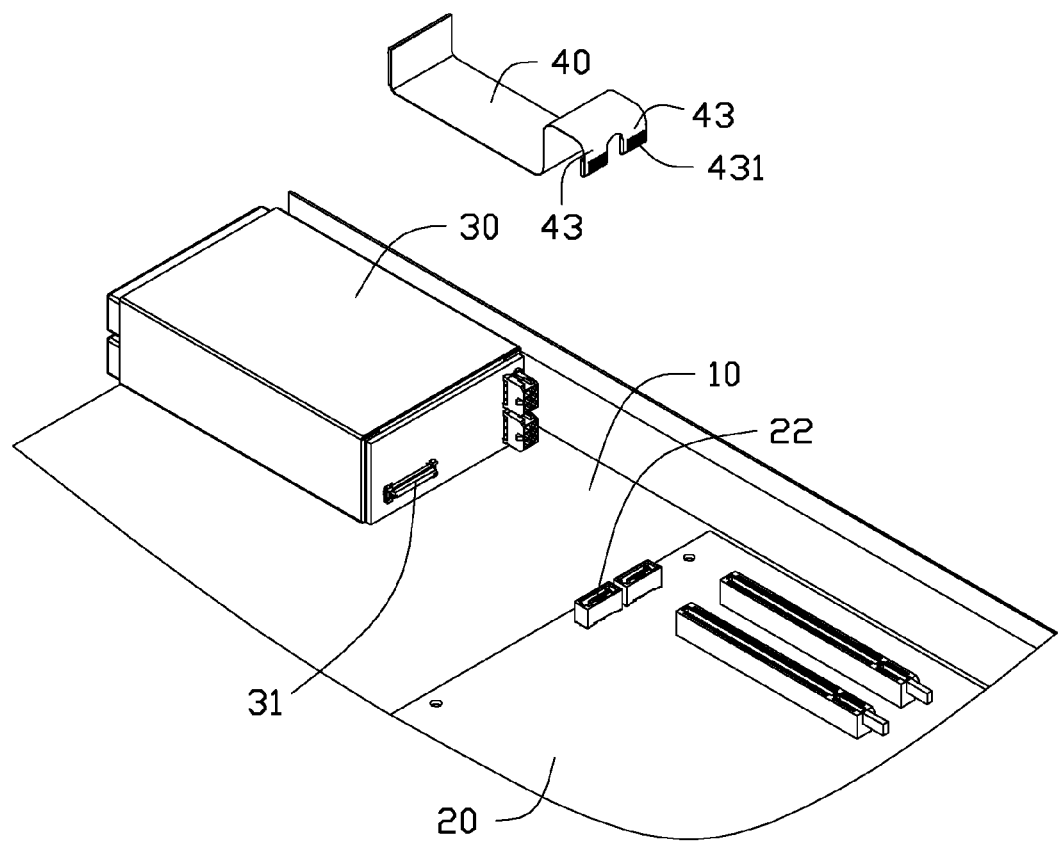
FIG. 1 is an exploded, isometric view of an embodiment of an electronic device, the electronic device includes a flexible flat cable.

Referring to FIG. 1, an exemplary embodiment of an electronic device includes a housing 10, a circuit board 20 arranged in the housing 10, an electronic module 30 arranged in the housing 10, and a flexible flat cable (FFC) 40. In one embodiment, the electronic device is a desktop computer.

Two connectors 22 are formed on the circuit board 20.

The electronic module 30 is an electronic apparatus, such as a hard disk drive (HDD) or a digital video disk (DVD) reader. The electronic module 30 also may be an assembly of several electronic apparatus. The electronic module 30 includes a connector 31.

Figure 2:
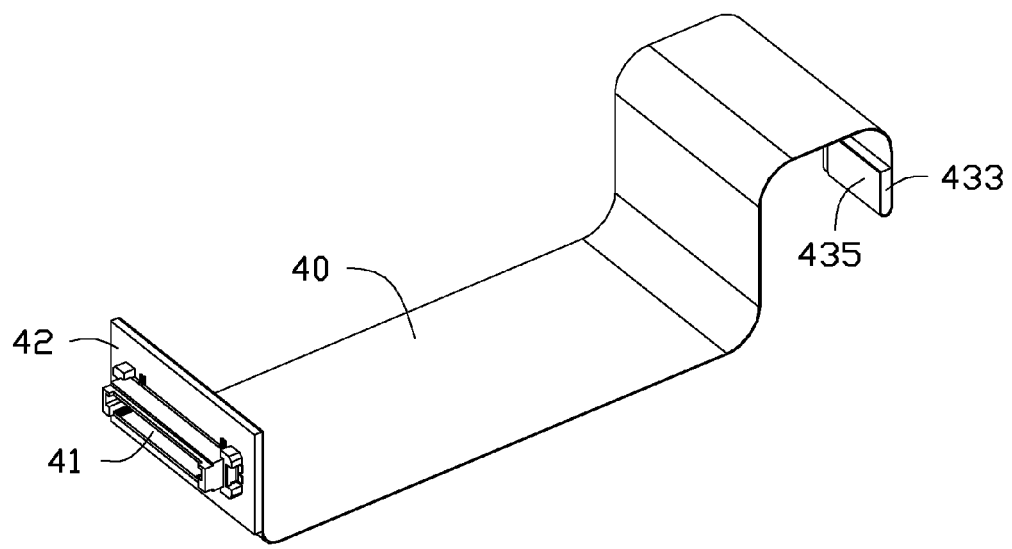
FIG. 2 is an enlarged view of the flexible flat cable of FIG. 1, but shows another perspective.

Referring to FIG. 2, a cable connector 41 is fixed to a first end of the FFC 40. A first reinforcing plate 42 is fixed between the cable connector 41 and the first end of the FFC 40. Two connecting pieces 43 are spaced and set on a second end of the FFC 40. Two edge connectors 431 are arranged on first sides of the connecting pieces 43, respectively, the edge connectors 431 including a data connector and a power connector. Two second reinforcing plates 433 are fixed on second sides of the connecting pieces 43, respectively.

In this embodiment, the edge connectors 431 are directly formed by processing the second end of the flexible flat cable 40. A fixing portion 435 extends from a distal end of each connecting piece 43, the fixing portion 435 is extended to be parallel to the connecting piece 43 sandwiching the second reinforcing plate 433 with a portion of the connecting piece 43 forming the edge connector 431.

Figure 3:
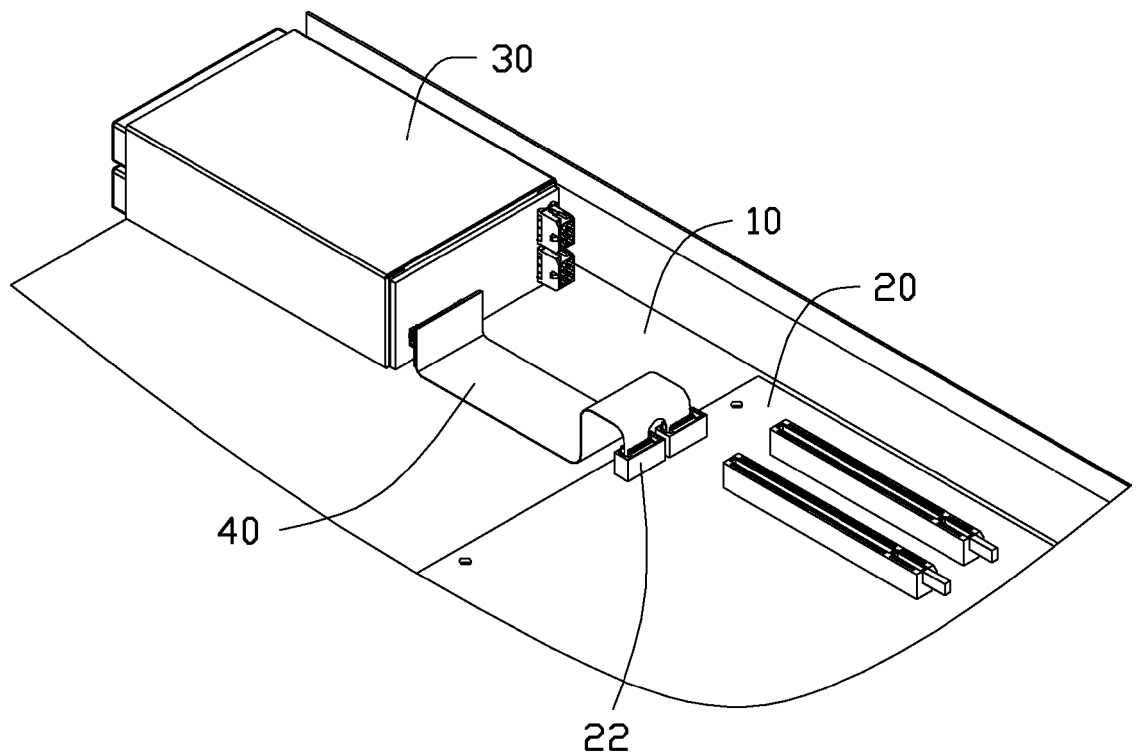
FIG. 3 is an assembled, isometric view of the electronic device of FIG. 1.

Referring to FIG. 3, in use, the cable connector 41 is electronically connected to the connector 31 of the electronic module 30. The edge connectors 431 are respectively electronically connected to the connectors 22 of the circuit board 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An electronic device comprising:
a housing;
a circuit board arranged in the housing, and comprising two first connectors formed on the circuit board;
an electronic module arranged in the housing, the electronic module comprising a second connector; and
a flexible flat cable (FFC) comprising a cable connector arranged at a first end of the FFC, and two spaced connecting pieces at a second end of the FFC, two edge connectors arranged on the connecting pieces, respectively, wherein the cable connector is electronically connected to the second connector of the electronic module, the edge connectors comprise a data connector and a power connector respectively electronically connected to the first connectors.

2. The electronic device of claim 1, wherein a first reinforcing plate is fixed between the cable connector and the first end of the FFC.

3. The electronic device of claim 1, wherein two second reinforcing plates are fixed at the second end of the FFC, opposite to the edge connectors, respectively.

4. The electronic device of claim 3, wherein two bent portions extend from the second end of the FFC, for sandwiching the second reinforcing plates together with the connecting pieces.

* * * * *